US012625210B2

(12) United States Patent
Takeshima

(10) Patent No.: US 12,625,210 B2
(45) Date of Patent: May 12, 2026

(54) MAGNETIC RESONANCE IMAGING APPARATUS, MAGNETIC RESONANCE IMAGING METHOD, AND NON-TRANSITORY COMPUTER READABLE MEDIUM

(71) Applicant: Canon Medical Systems Corporation, Otawara (JP)

(72) Inventor: Hidenori Takeshima, Tokyo (JP)

(73) Assignee: Canon Medical Systems Corporation, Otawara (JP)

( * ) Notice: Subject to any disclaimer, the term of this patent is extended or adjusted under 35 U.S.C. 154(b) by 76 days.

(21) Appl. No.: 18/357,272

(22) Filed: Jul. 24, 2023

(65) Prior Publication Data

US 2024/0036137 A1 Feb. 1, 2024

(30) Foreign Application Priority Data

Jul. 27, 2022 (JP) ................................. 2022-119877

(51) Int. Cl.
*G01R 33/54* (2006.01)
*G01R 33/48* (2006.01)
*G01R 33/485* (2006.01)

(52) U.S. Cl.
CPC ....... *G01R 33/543* (2013.01); *G01R 33/4824* (2013.01); *G01R 33/485* (2013.01)

(58) Field of Classification Search
CPC .............. G01R 33/543; G01R 33/4824; G01R 33/485; G01R 33/5617
See application file for complete search history.

(56) References Cited

U.S. PATENT DOCUMENTS 6,011,392 A * 1/2000 Zhou ................ G01R 33/56581
324/309
9,360,545 B2 * 6/2016 Mugler, III ........ G01R 33/5617

OTHER PUBLICATIONS

M. Garwood et al. "Advances in Magnetic Resonance The Return of the Frequency Sweep: Designing Adiabatic Pulses for Contemporary NMR"; Journal of Magnetic Resonance, vol. 153, pp. 155-177, 2001 (23 pages).
T.W.J. Scheenen et al.., "Short Echo Time 1H-MRSI of the Human Brain at 3T With Minimal Chemical Shift Displacement Errors Using Adiabatic Refocusing Pulses" Magnetic Resonance in Medicine, vol. 59, pp. 1-6, 2008 (6 pages).
G. Oz et al., "Short-Echo, Single-Shot, Fully-Intensity Proton Magnetic Resonance Spectroscopy for Neurochemical Profiling at 4 T: Validation in the Cerebellum and Brainstem" Magnetic Resonance in Medicine, vol. 65, pp. 901-910, 2011 (10 pages).

(Continued)

*Primary Examiner* — G.M. A Hyder

(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry is configured to design a pulse sequence including a plurality of refocus pulses and a plurality of crusher gradient fields, in such a manner that a first crusher gradient field to be applied after a first refocus pulse group and a second crusher gradient field to be applied before a second refocus pulse group after the first refocus pulse group overlap one another at least partially. The processing circuitry is configured to acquire magnetic resonance spectroscopic signals by executing the designed pulse sequence.

12 Claims, 5 Drawing Sheets

(56) References Cited

OTHER PUBLICATIONS

Office Action issued Jan. 27, 2026, in corresponding Japanese Patent Application No. 2022-119877, 5 pages.
Landheer et al., Dephasing optimization through coherence order pathway selection (DOTCOPS) for improved crusher schemes in MR spectroscopy, Magnetic Resonance in Medicine, 2019, vol. 81, p. 2209-2222.

* cited by examiner

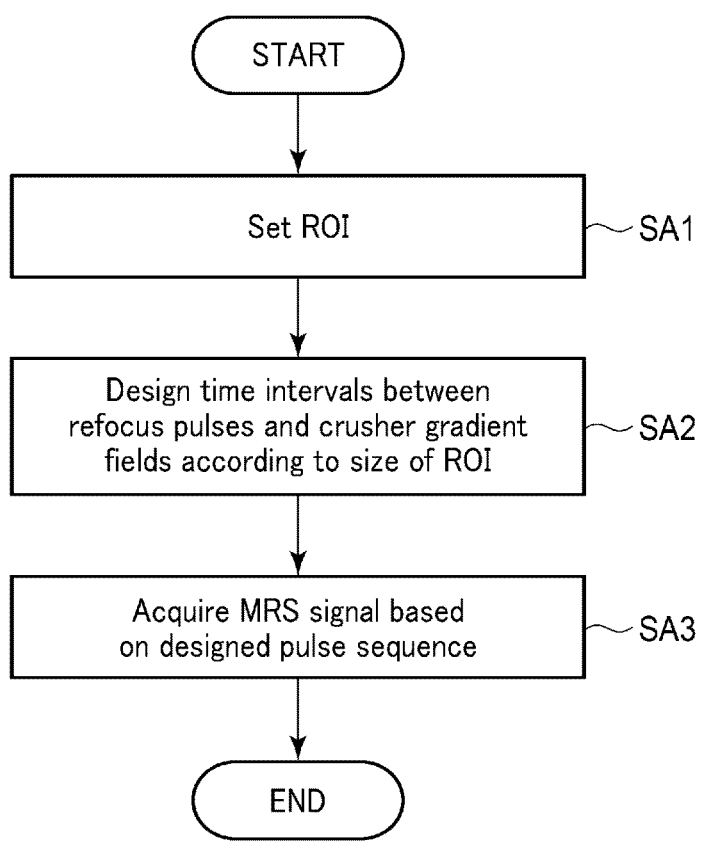
F I G. 2

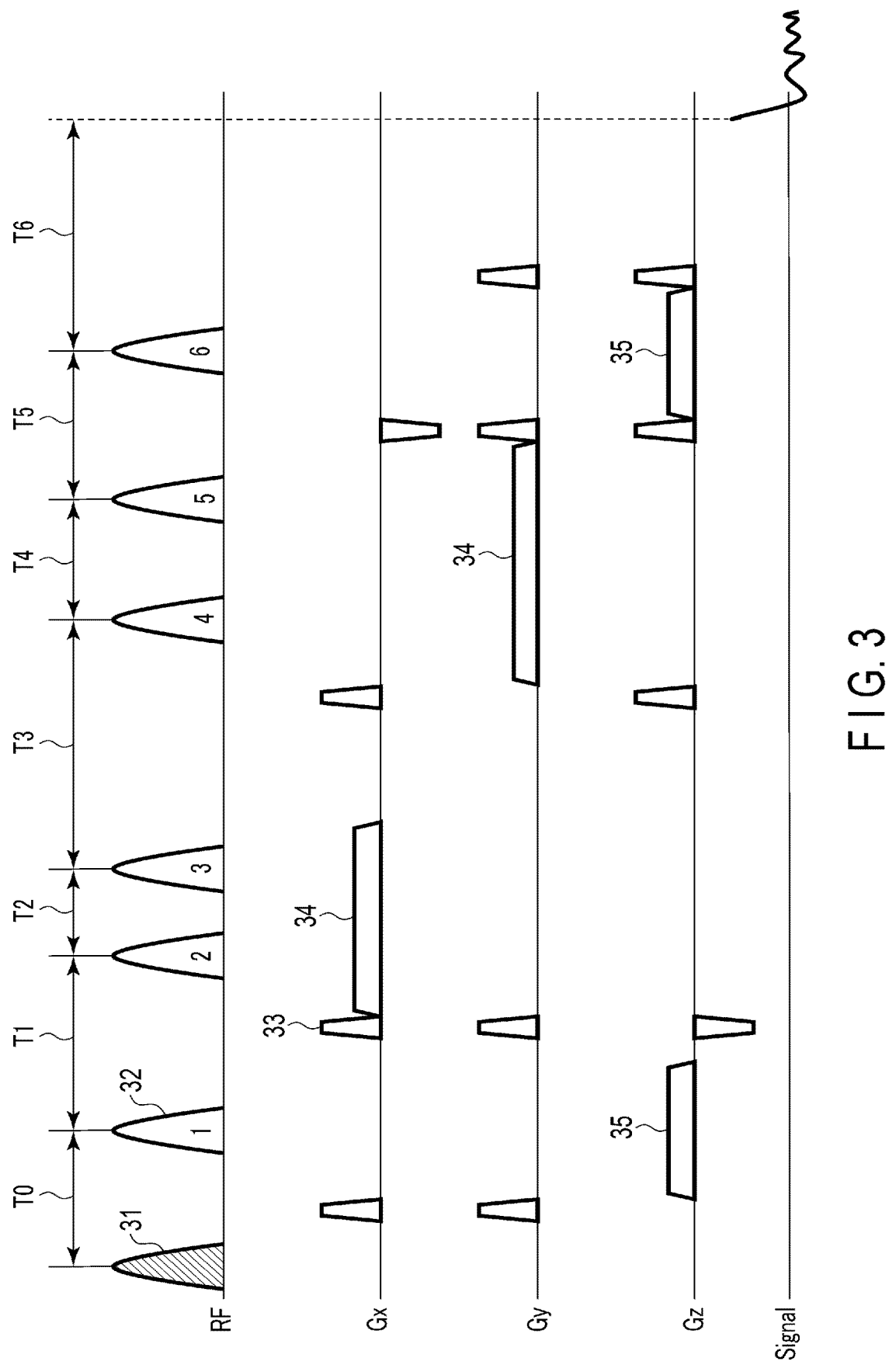
F I G. 3

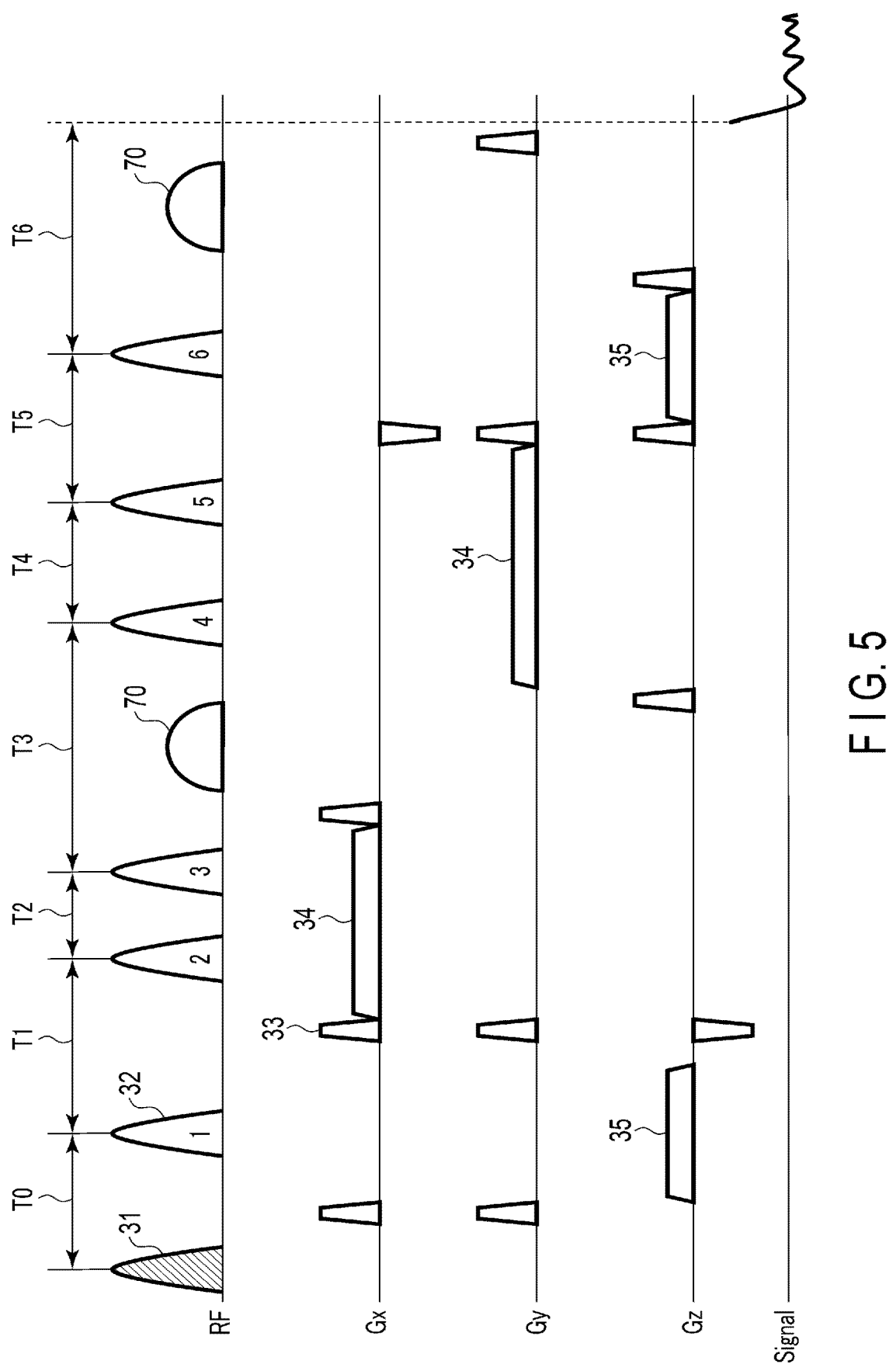
F I G. 5

MAGNETIC RESONANCE IMAGING APPARATUS, MAGNETIC RESONANCE IMAGING METHOD, AND NON-TRANSITORY COMPUTER READABLE MEDIUM

CROSS-REFERENCE TO RELATED APPLICATION

This application is based upon and claims the benefit of priority from Japanese Patent Application No. 2022-119877, filed Jul. 27, 2022, the entire contents of which are incorporated herein by reference.

FIELD

Embodiments described herein relate generally to a magnetic resonance imaging apparatus, a magnetic resonance imaging method, and a non-transitory computer readable medium.

BACKGROUND

Of the major techniques for magnetic resonance spectroscopic (MRS) imaging sequences such as point resolved spectroscopy (PRESS), image-selected in vivo spectroscopy (ISIS), and localization by adiabatic selective refocusing (LASER), the LASER technique has high volume of interest (VOI) selection precision due to a low amount of contamination of unwanted signals beyond a region of interest to be excited. However, the LASER technique has a problem that two refocus pulses need to be transmitted with respect to each of the gradient fields Gx, Gy, and Gz, namely, six refocus pulses in total need to be transmitted, resulting in an increase in the TE.

Thus, semi-LASER, in which four refocus pulses in total are applied, is often used as an alternative to LASER; however, in semi-LASER, only a gradient field for normal slice selection is applied (a gradient field for the refocus pulses is not applied) with respect to an axis. Thus, there is a problem of deterioration in slice characteristics with respect to the axial direction in which a gradient field for normal slice selection is applied.

BRIEF DESCRIPTION OF THE DRAWINGS

FIG. 2 is a flowchart showing an operation of the magnetic resonance imaging apparatus according to the present embodiment.

FIG. 3 is a diagram showing a first design example of a pulse sequence according to the present embodiment.

FIG. 5 is a diagram showing a third design example of the pulse sequence according to the present embodiment.

DETAILED DESCRIPTION

In general, according to one embodiment, a magnetic resonance imaging apparatus includes processing circuitry. The processing circuitry is configured to design a pulse sequence including a plurality of refocus pulses and a plurality of crusher gradient fields, in such a manner that a first crusher gradient field to be applied after a first refocus pulse group and a second crusher gradient field to be applied before a second refocus pulse group after the first refocus pulse group overlap one another at least partially. The processing circuitry is configured to acquire magnetic resonance spectroscopic signals by executing the designed pulse sequence.

Hereinafter, a magnetic resonance imaging apparatus, a magnetic resonance imaging method, and a program according to the present embodiment will be described with reference to the accompanying drawings. In the embodiments to be described below, elements assigned the same reference symbols are assumed to perform similar operations, and redundant descriptions will be omitted where unnecessary. An embodiment will be described below with reference to the accompanying drawings.

Figure 1:
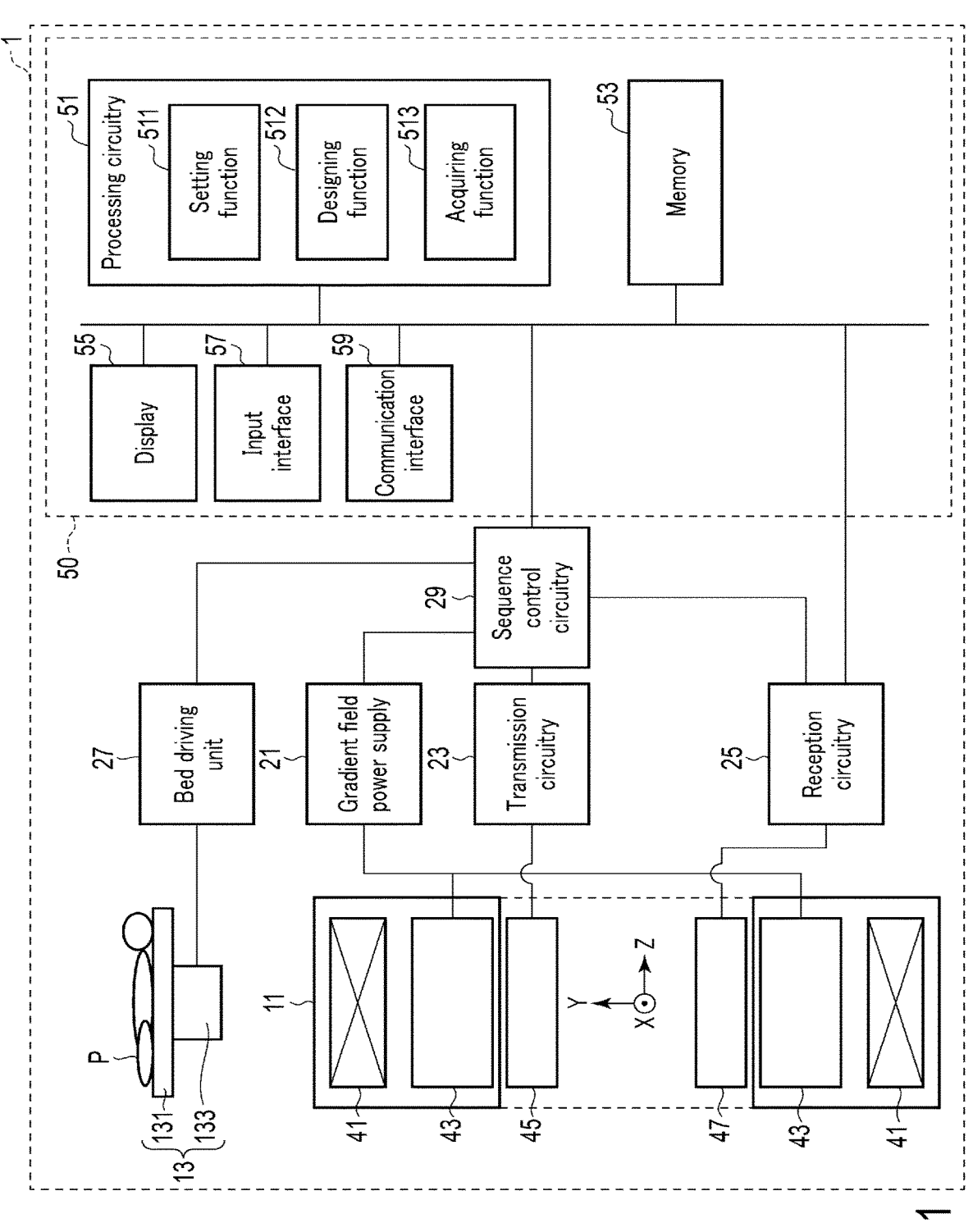
FIG. 1 is a block diagram showing a magnetic resonance imaging apparatus according to the present embodiment.

FIG. 1 is a block diagram showing a configuration example of a magnetic resonance imaging apparatus 1 according to the present embodiment. As shown in FIG. 1, the magnetic resonance imaging apparatus 1 includes a gantry 11, a bed 13, a gradient field power supply 21, transmission circuitry 23, reception circuitry 25, a bed driving unit 27, sequence control circuitry 29, and a medical information processor (host computer) 50.

The gantry 11 includes a static field magnet 41 and a gradient field coil 43. The static field magnet 41 and the gradient field coil 43 are accommodated in a housing of the gantry 11. A hollow-shaped bore is formed in the housing of the gantry 11. In the bore of the gantry 11, a transmitter coil 45 and a receiver coil 47 are disposed.

The static field magnet 41 has a hollow, substantially cylindrical shape, and produces a static field in the interior of the substantial cylinder. Examples of the static field magnet 41 that may be used include a permanent magnet, a superconducting magnet, a normal conducting magnet, etc. It is assumed herein that the central axis of the static field magnet 41 is defined as a Z axis, that an axis vertically orthogonal to the Z axis is defined as a Y axis, and that an axis horizontally orthogonal to the Z axis is defined as an X axis. The X, Y, and Z axes configure an orthogonal three-dimensional coordinate system.

The gradient field coil 43 is a coil unit attached to the inside of the static field magnet 41 and formed in a hollow, substantially cylindrical shape. The gradient field coil 43 produces a gradient field upon receiving a current supply from the gradient field power supply 21. More specifically, the gradient field coil 43 includes three coils that respectively correspond to the X, Y, and Z axes and are orthogonal to one another. The three coils respectively form, along the X, Y, and Z axes, gradient fields with varying magnetic field intensities. The gradient fields respectively formed along the X, Y, and Z axes are synthesized, and a frequency encoding gradient field Gr, a phase encoding gradient field Gp, and a slice selective gradient field Gs, which are orthogonal to one another, are formed in desired directions. The frequency encoding gradient field Gr is employed to vary the frequency of a magnetic resonance signal (hereinafter referred to as an "MR signal") in accordance with the spatial position. The phase encoding gradient magnetic field Gp is employed to vary the phase of an MR signal in accordance with the spatial position. The slice selective gradient field Gs is employed to freely determine an imaging section (slice). In the description that follows, it is assumed that the direction of the gradient of the frequency encoding gradient field Gr is the X axis, that the direction of the gradient of the phase encoding gradient field Gp is the Y axis, and that the direction of the gradient of the slice selective gradient field Gs is the Z axis.

The gradient field power supply 21 supplies a current to the gradient field coil 43 in accordance with a sequence control signal from the sequence control circuitry 29. By supplying the current to the gradient field coil 43, the gradient field power supply 21 causes the gradient field coil 43 to produce gradient fields along the X, Y, and Z axes. The gradient fields are superimposed on the static fields formed by the static field magnet 41, and are applied to an object P.

The transmitter coil 45 is, for example, disposed inside the gradient field coil 43, and produces a radiofrequency pulse (hereinafter referred to as an "RF pulse") in response to a current supply from the transmission circuitry 23.

The transmission circuitry 23 supplies a current to the transmitter coil 45 to apply, to an object P via the transmitter coil 45, an RF pulse for exciting a target proton existing in the object P. The RF pulse oscillates at a resonant frequency inherent to the target proton, and excites the target proton. An MR signal is generated from the excited target proton, and is detected by the receiver coil 47. The transmitter coil 45 is, for example, a whole-body coil (WB coil). The whole-body coil may be used as a transmitter/receiver coil.

By the action of the RF pulse, the receiver coil 47 receives the MR signal issued from the target proton existing in the object P. The receiver coil 47 includes a plurality of receiver coil elements configured to receive an MR signal. The received MR signal is supplied to the reception circuitry 25 in a wired or wireless manner. Although not illustrated in FIG. 1, the receiver coil 47 includes a plurality of receiver channels provided in a parallel manner. Each receiver channel includes a receiver coil element configured to receive an MR signal, an amplifier configured to amplify the MR signal, and the like. The MR signal is output for each receiver channel. The total number of receiver channels may be equal to, greater than, or smaller than the total number of receiver coil elements.

The reception circuitry 25 receives the MR signal generated from the excited target proton via the receiver coil 47. The reception circuitry 25 signal-processes the received MR signals, and generates a digital MR signal. A digital MR signal can be expressed in a k-space defined by a spatial frequency. Accordingly, a digital MR signal will be hereinafter referred to as "k-space data". The k-space data is an example of an MR acquisition signal. The k-space data is supplied to the medical information processor 50 in a wired or wireless manner.

The transmitter coil 45 and the receiver coil 47 are described merely as an example. Instead of the transmitter coil 45 and the receiver coil 47, a transmitter/receiver coil equipped with both a transmitting function and a receiving function may be used. Also, the transmitter coil 45, the receiver coil 47, and the transmitter/receiver coil may be combined.

The bed 13 is installed adjacent to the gantry 11. The bed 13 includes a top 131 and a base 133. The object P is mounted on the top 131. The base 133 slidably supports the top 131 along each of the X, Y, and Z axes. The bed driving unit 27 is accommodated in the base 133. The bed driving unit 27 moves the top 131 under control of the sequence control circuitry 29. The bed driving unit 27 may include, for example, any motor such as a servomotor, a stepping motor, etc.

The sequence control circuitry 29 includes, as hardware resources, a processor such as a central processing unit (CPU) or a micro processing unit (MPU) and a memory such as a read-only memory (ROM) or a random-access memory (RAM). The sequence control circuitry 29 acquires k-space data relating to the object P by synchronously controlling the gradient field power supply 21, the transmission circuitry 23, and the reception circuitry 25 based on data acquisition conditions set by the processing circuitry 51, and performing data acquisition on the object P according to the data acquisition conditions. The sequence control circuitry 29 is an example of a sequence control unit.

The sequence control circuitry 29 according to the present embodiment executes data acquisition for magnetic resonance spectroscopy (hereinafter also referred to "MRS"), which is a type of chemical shift measurement. The chemical shift measurement is a technique of measuring a chemical shift, which is a minor difference in the resonant frequency of target protons such as hydrogen nuclei caused by differences in the chemical environment. The MRS includes a single voxel technique in which data is acquired for a single voxel and a multi-voxel technique in which data is acquired for multiple voxels, and the present embodiment is applicable to both of these techniques. The multi-voxel technique is also referred to as chemical shift imaging (CSI), MRS imaging (MRSI), etc. It is to be noted that the voxel of the measurement target region will also be referred to as a "voxel of interest (VOI)". In the present embodiment, a two-dimensional region and a voxel of interest denoted by the MRSI can be collectively referred to as a region of interest (ROI).

The sequence control circuitry 29 executes data acquisition for MRS on the object P. By executing data acquisition for MRS, a free induction decay (FID) signal or a spin echo signal is generated from a voxel of interest of the object P. The reception circuitry 25 receives an FID signal or a spin echo signal via the receiver coil 47, signal-processes the received FID signals or spin echo signals, and acquires k-space data relating to the voxel of interest. It is assumed that the acquired k-space data is digital data representing the intensity value of a signal issued from the voxel of interest as a time function. A pulse sequence for MRS is repeated by the number of excitations (NEX), and k-space data corresponding to the NEX is acquired. The k-space data acquired by MRS is referred to as "MRSk data". The MRSk data is an example of an MRS signal.

In the present embodiment, localization by adiabatic selective refocusing (LASER) technique is used for the MRS pulse sequence. Hereinafter, an MRS pulse sequence based on the LASER technique will also be referred to as a "LASER pulse sequence".

As shown in FIG. 1, the medical information processor 50 is a computer including processing circuitry 51, a memory 53, a display 55, an input interface 57, and a communication interface 59.

The processing circuitry 51 includes a processor such as a CPU as a hardware resource. The processing circuitry 51 functions as the nerve center of the magnetic resonance imaging apparatus 1. For example, the processing circuitry 51 implements, through execution of various programs, a setting function 511, a designing function 512, and an acquiring function 513.

With the setting function 511, the processing circuitry 51 sets a VOI (Volume of Interest).

With the designing function 512, the processing circuitry 51 designs a pulse sequence by designing, based on a LASER pulse sequence, a first crusher gradient field to be applied after a first refocus pulse group, and a second crusher gradient field to be applied before a second-order refocus pulse after the first refocus pulse group, in such a manner that the first crusher gradient field and the second crusher gradient field overlap one another at least partially.

With the acquiring function 513, the processing circuitry 51 controls the sequence control circuitry 29 and executes the pulse sequence designed with the designing function 512, thereby acquiring MRS signals in the VOI.

The memory 53 is a storage device configured to store a variety of information, and is, for example, a hard disk drive (HDD), a solid-state drive (SSD), an integrated circuit memory device, etc. The memory 53 may also be a drive, etc. configured to read and write a variety of information to and from a CD-ROM drive, a DVD drive, a portable storage medium such as a flash memory, etc. The memory 53 stores, for example, medical data, MRS signals, control programs, etc. that have been previously acquired.

The display 55 displays various information. For the display 55, a CRT display, a liquid crystal display, an organic EL display, an LED display, a plasma display, or any other display known in the present technical field, for example, may be suitably employed.

The input interface 57 includes an input device that accepts various instructions from the user. For the input device, a keyboard, a mouse, various types of switches, a touch screen, a touch pad, etc. may be employed. The input device is not limited to a device including physical operational components, such as a mouse and a keyboard. Examples of the input interface 57 include electrical signal processing circuitry configured to receive an electrical signal corresponding to an input operation from an external input device provided separately from the magnetic resonance imaging apparatus 1 and output the received electrical signal to various circuits. The input interface 57 may be a speech recognition device configured to convert an audio signal acquired by a microphone into an instruction signal.

The communication interface 59 is an interface configured to connect, via a local area network (LAN), etc., the magnetic resonance imaging apparatus 1 with a workstation, a picture archiving and communication system (PACS), a hospital information system (HIS), a radiology information system (RIS), and the like. The communication interface 59 transmits and receives various types of information to and from the workstation, the PACS, the HIS, and the RIS to which the communication interface 59 is connected.

Next, an operation example of the magnetic resonance imaging apparatus 1 according to the present embodiment will be described with reference to the flowchart of FIG. 2.

At step SA1, the processing circuitry 51 sets, with the setting function 511, a VOI in an object. It suffices that a three-dimensional region to be a measurement target is set by, for example, a user input made via an input interface 57. Also, the processing circuitry 51 may automatically set a VOI according to the site to be imaged, the case, etc.

At step SA2, with the designing function 512, the processing circuitry 51 designs a pulse sequence by adjusting time intervals between refocus pulses and crusher gradient fields in the LASER pulse sequence, according to the size of the VOI. The crusher gradient field is a gradient field to be applied to reduce or eliminate remaining transverse magnetization. A concrete example of a method of designing a pulse sequence will be described later with reference to FIG. 3 and the subsequent drawings.

At step SA3, with the acquiring function 513, the processing circuitry 51 executes the pulse sequence designed at step SA2, thereby acquiring an MRS signal. The processing circuitry 51 displays, on the display 55, for example, spectrums based on the acquired MRS signal. The number of repetitions of the pulse sequence, which is repeatedly executed to acquire an MRS signal, can be determined based on, for example, the number of excitations of the MRS signal.

Next, a first design example of the pulse sequence according to the present embodiment will be described with reference to FIG. 3.

FIG. 3 is a pulse sequence diagram according to the first design example in which six adiabatic pulses are used as refocus pulses, similarly to the LASER pulse sequence. FIG. 3 shows, from the top, sequences of an RF, a gradient field Gx in an x-axis direction, a gradient field Gy in a y-axis direction, a gradient field Gz in a z-axis direction, and an MRS signal.

The MRS signal shown at the bottom is acquired by applying an excitation pulse 31, and then localizing an VOI with six refocus pulses 32 with respect to the three axes, namely, the x, y, and z axes.

In the example of FIG. 3, for convenience of explanation, the refocus pulses 32 are numbered from "refocus pulse 1" to "refocus pulse 6" according to the order of application. Also, a time interval between the excitation pulse 31 and the refocus pulse 1 will be defined as a "time interval T0", a time interval between the refocus pulse 1 and the refocus pulse 2 will be defined as a "time interval T1", a time interval between the refocus pulse 2 and the refocus pulse 3 will be defined as a "time interval T2", a time interval between the refocus pulse 3 and the refocus pulse 4 will be defined as a "time interval T3", a time interval between the refocus pulse 4 and the refocus pulse 5 will be defined as a "time interval T4", a time interval between the refocus pulse 5 and the refocus pulse 6 will be defined as a "time interval T5", and a time interval between the refocus pulse 6 and the MRS signal will be defined as a "time interval T6".

As shown in FIG. 3, with the designing function 512, the processing circuitry 51 designs a crusher gradient field 33 in which a first crusher gradient field to be applied after a first refocus pulse group and a second crusher gradient field to be applied before a second refocus pulse group immediately after the first refocus pulse group overlap at least partially.

Specifically, at a time interval T1, a crusher gradient field 33, in which a first crusher gradient field and a second crusher gradient field overlap one another (bundled into one) is applied. For example, at the time interval T1 between the refocus pulse 1 and the refocus pulse 2, a single crusher gradient field 33 is applied in each axis. At the time interval T3 between the refocus pulse 3 and the refocus pulse, a single crusher gradient field 33 is applied in each of the x and z axes. At the time interval T5 between the refocus pulse 5 and the refocus pulse 6, a single crusher gradient field 33 is applied in each axis.

In the example of FIG. 3, a single crusher gradient field 33 is designed in both of the time intervals T3 and T5; however, two non-overlapping first crusher gradient fields and two non-overlapping second crusher gradient fields may be independently arranged at each of the time intervals T3 and T5. That is, in the pulse sequence shown in FIG. 3, it suffices that at least one crusher gradient field 33 in which the first crusher gradient field and the second crusher gradient field overlap at least partially is designed.

Furthermore, with the designing function 512, the processing circuitry 51 designs the time intervals T2 and T4 to be shorter than any of the time intervals T1, T3, and T5, or to be shorter than an average of the time intervals T1, T3, and T5.

The time intervals T2 and T4 are designed to satisfy temporal restraint conditions regarding the period from the excitation pulse 31 to the acquisition of the MRS signal. The temporal restraint conditions are that a total amount of time of the time intervals T0, T2, T4, and T6 is equal to a total amount of time of the time intervals T1, T3, and T5. The total amount of time can also be referred to as "half an echo time (TE/2)".

Also, as shown in FIG. 3, with the designing function 512, the processing circuitry 51 continuously applies a region selective gradient field 34 regarding the refocus pulses 2 and 3 at the time interval T2. Similarly, with the designing function 512, the processing circuitry 51 continuously applies a region selective gradient field 34 regarding the refocus pulses 4 and 5 at the time interval T4.

Specifically, in the x-axis gradient field Gx, a region selective gradient field 34 is designed to be continuously applied during the time interval T2. Similarly, in the y-axis gradient field Gy, a region selective gradient field 34 is designed to be continuously applied during the time interval T4.

In other words, at time intervals T2 and T4, a gradient field in which crusher gradient fields to be applied are bundled is similarly applied. In other words, the region selective gradient field 34 is applied in a state in which a crusher gradient field to be applied after the refocus pulse 2 and a crusher gradient field to be applied before the refocus pulse 3 are bundled. With such a configuration, it is possible to reduce the time for applying a crusher gradient field in each of the time intervals T2 and T4, while reducing or eliminating remaining transverse magnetization, thereby shortening the echo time (TE).

Moreover, a region selective gradient field 35 is applied at the timing of each of the refocus pulses 1 and 6, and a crusher gradient field is applied before and after each of the refocus pulses 1 and 6 (before and after the gradient field 35), similarly to the general LASER technique.

It is to be noted that, with the designing function 512, the processing circuitry 51 may design the time intervals T2 and T4 according to the required intensity of the crusher gradient field. It suffices that at least one of the time intervals T2 and T4 is designed, for example, to be long in such a manner that the intensity of the crusher gradient field becomes higher (the area as shown in the pulse sequence becomes greater) as the size of the VOI increases. Specifically, in the case of a VOI that is 1 cm long in the y and z axes and 2.5 cm long in the x axis, since the x-axis length is greater than the lengths in the other axes, it suffices that the time interval T2 is designed to be longer than the time interval T4 in the x-axis gradient field Gx in the example of FIG. 3.

With the designing function 512, the processing circuitry 51 may design the gradient field 35 in such a manner that region selection is performed with respect to a longest axis of a VOI in the axial direction by the general LASER technique, namely, excitation is performed with the refocus pulses 1 and 6.

If the processing circuitry 51 adjusts, with the designing function 512, the time intervals T2 and T4 according to the size of the VOI, there may be a lower limit to the size of the VOI to avoid the case where the transverse magnetization cannot be sufficiently eliminated because of short time intervals T2 and T4. If the processing circuitry 51 adjusts, with the designing function 512, the time intervals T2 and T4 according to the size of the VOI with a lower-limit value set to the time intervals T2 and T4, the time intervals T2 and T4 may be set to the lower-limit value even if the time intervals T2 and T4 can be set to be shorter than the lower-limit value.

The time intervals T0 to T6 may be different from one another. Alternatively, at least two of the time intervals T1, T3, and T5 may be identical. The time intervals T2 and T4 may be identical.

Next, a second setting example of the MRS pulse sequence according to the present embodiment will be described with reference to FIG. 4.

An even smaller crusher gradient field 40 may be added to the MRS pulse sequence shown in FIG. 3. In the example of FIG. 4, a small crusher gradient field 40 is designed to be applied before and after each of the refocus pulses 2 and 4. It is thereby possible to reduce or eliminate remaining transverse magnetization, thereby suppressing unwanted signals.

Next, a third setting example of the MRS pulse sequence according to the present embodiment will be described with reference to FIG. 5.

The MRS pulse sequence shown in FIG. 5 is based on a MEGA-LASER pulse sequence including a MEGA pulse, which is a frequency selection pulse.

In the case of using a MEGA pulse 70, the processing circuitry 51 designs, with the designing function 512, the MEGA pulse 70 (180-degree pulse) to be applied, without applying a gradient field, between the refocus pulse 3 and the refocus pulse 4 and after the refocus pulse 6.

Figure 4:
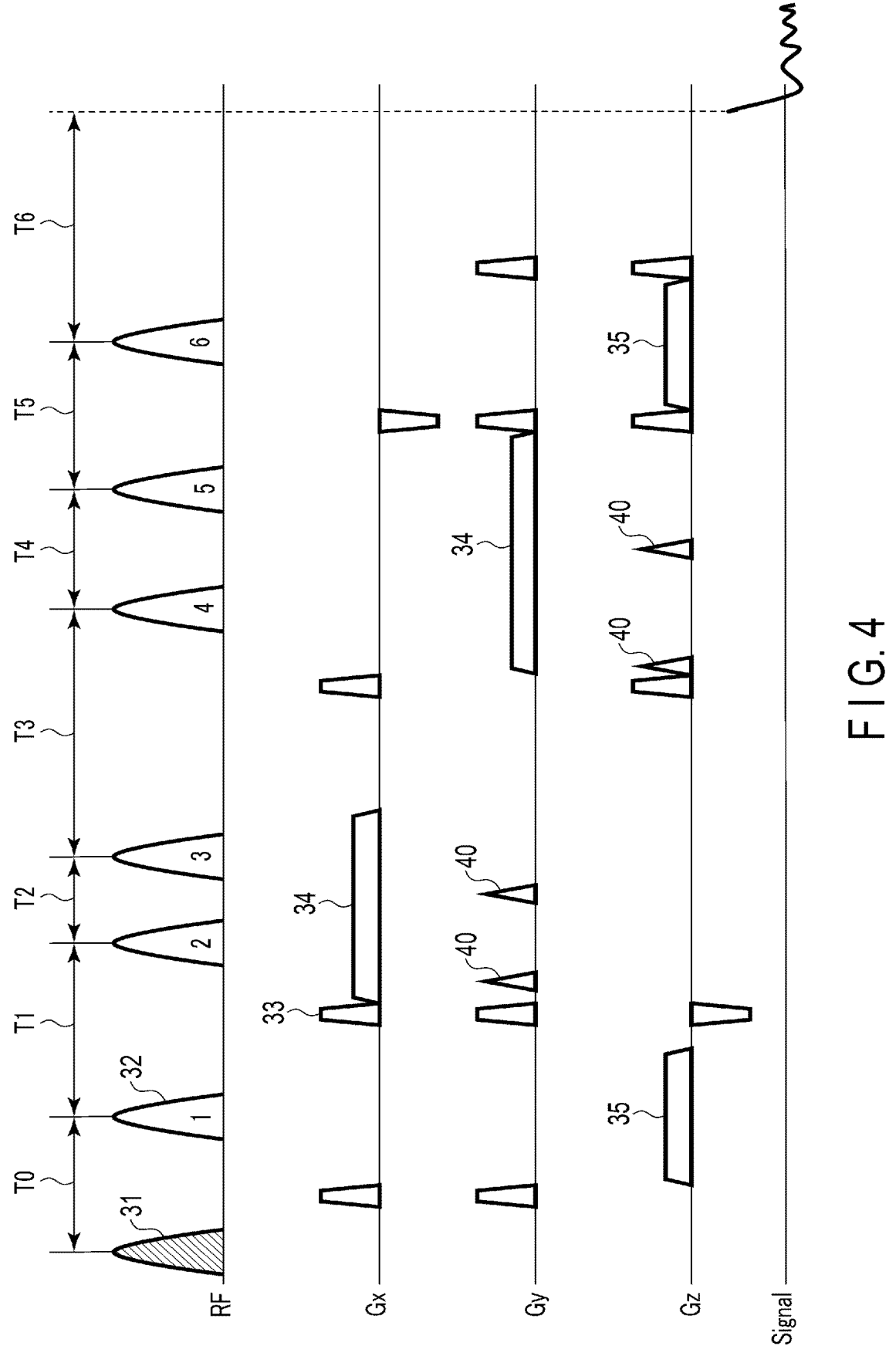
FIG. 4 is a diagram showing a second design example of the pulse sequence according to the present embodiment.

By calculating a differential signal between a pulse sequence including the MEGA pulse 70 shown in FIG. 5 and a pulse sequence without the MEGA pulse 70 shown in FIG. 3 or 4, it is possible, for example, to improve the identification precision of the type (e.g., a gamma aminobutyric acid (GABA)) of some of the molecules having signals for different frequency shift values.

With the designing function 512, the processing circuitry 51 may set the pulse lengths of all the adiabatic pulses used as the refocus pulses 1 to 6 between, for example, 2.6 milliseconds and 3.4 milliseconds. The band of the adiabatic pulses may be designed between, for example, 2.0 kilohertz (kHz) and 5 kilohertz (kHz).

According to the present embodiment described above, a pulse sequence is designed by designing a first crusher gradient field to be applied after a first refocus pulse group and a second crusher gradient field to be applied before a second refocus pulse group after the first refocus pulse group, in such a manner that the first crusher gradient field and the second crusher gradient field overlap one another at least partially. Moreover, a time interval T2 between a second refocus pulse and a third refocus pulse and a time interval T4 between a fourth refocus pulse and a fifth refocus pulse are designed to be shorter than time intervals T1, T3, and T5 between the other refocus pulses.

With such a configuration, since two refocus pulses can be used in each of the x, y, and z axes, instead of reducing the total number of refocus pulses to four as in semi-LASER, it is possible to shorten the echo time (TE) of the pulse sequence, while maintaining a high level of excitation precision.

Herein, the term "processor" used in the above description means, for example, circuitry such as a central processing unit (CPU), a graphics processing unit (GPU), an application-specific integrated circuit (ASIC), or a programmable logic device (e.g., a simple programmable logic device (SPLD), a complex programmable logic device (CPLD), or a field-programmable gate array (FPGA). If the processor is, for example, a CPU, the processor reads and executes programs stored in storage circuitry to implement the functions. If the processor is, for example, an ASIC, the functions are directly incorporated into the circuitry of the processor as logic circuitry, instead of the programs being stored in the storage circuitry. Each processor in the present embodiment is not limited to a single circuitry-type processor, and multiple independent circuits may be combined and integrated as a single processor to realize the intended functions. Furthermore, the functions may be implemented by a single processor into which multiple components shown in the drawings are incorporated.

In addition, the functions according to the embodiment may be implemented by installing a program for executing the process into a computer such as a workstation and expanding the program on the memory. At this time, the program capable of causing the computer to execute such an approach may be stored in a storage medium such as a magnetic disk (hard disk), an optical disk (a CD-ROM, a DVD, etc.), a semiconductor memory, etc. and distributed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: processing circuitry configured to:
   design a pulse sequence including a plurality of refocus pulses and a plurality of crusher gradient fields, in such a manner that a first crusher gradient field and a second crusher gradient field, each to be applied between adjacent refocus pulses of the plurality of refocus pulses, are combined into one; and
   acquire magnetic resonance spectroscopic signals by executing the designed pulse sequence,
   wherein the pulse sequence includes six refocus pulses.

2. The magnetic resonance imaging apparatus according to claim 1, wherein
   a second refocus pulse and a fourth refocus pulse are included in the six refocus pulses,
   a third refocus pulse and a fifth refocus pulse are included in the six refocus pulses, and
   a time interval between the second refocus pulse and the third refocus pulse and a time interval between the fourth refocus pulse and the fifth refocus pulse are each shorter than a time interval between other refocus pulses.

3. The magnetic resonance imaging apparatus according to claim 2, wherein the processing circuitry is further configured to continuously apply, as the first crusher gradient field and the second crusher gradient field combined into one, a region selective gradient field regarding the second refocus pulse and the third refocus pulse, for the time interval between the second refocus pulse and the third refocus pulse.

4. The magnetic resonance imaging apparatus according to claim 2, wherein the processing circuitry is further configured to continuously apply, as the first crusher gradient field and the second crusher gradient field combined into one, a region selective gradient field regarding the fourth refocus pulse and the fifth refocus pulse, for the time interval between the fourth refocus pulse and the fifth refocus pulse.

5. The magnetic resonance imaging apparatus according to claim 2, wherein the processing circuitry is further configured to design a time interval between the second refocus pulse and the third refocus pulse and a time interval between the fourth refocus pulse and the fifth refocus pulse to be longer as a required crusher intensity increases.

6. The magnetic resonance imaging apparatus according to claim 2, wherein the processing circuitry is further configured to design a time interval between the second refocus pulse and the third refocus pulse and a time interval between the fourth refocus pulse and the fifth refocus pulse to be longer as a size of a volume of interest (VOI) in an axial direction increases.

7. The magnetic resonance imaging apparatus according to claim 1, wherein the processing circuitry is further configured to apply a MEGA pulse between a third refocus pulse and a fourth refocus pulse, and apply the MEGA pulse after a sixth refocus pulse, the MEGA pulse being a frequency selection pulse, the third refocus pulse, the fourth refocus pulse, and the sixth refocus pulse being included in the six refocus pulses.

8. The magnetic resonance imaging apparatus according to claim 1, wherein each of the six refocus pulses is designed to have a pulse length from 2.6 milliseconds to 3.4 milliseconds and have a pulse band from 2 kHz to 5 kHz.

9. A magnetic resonance imaging comprising:
   processing circuitry configured to:
   design a pulse sequence including a plurality of refocus pulses and a plurality of crusher gradient fields, in such a manner that a first crusher gradient field and a second crusher gradient field, each to be applied between adjacent refocus pulses of the plurality of refocus pulses, are combined into one; and
   acquire magnetic resonance spectroscopic signals by executing the designed pulse sequence,
   wherein the pulse sequence is a localization by adiabatic selective refocusing (LASER) pulse sequence.

10. The magnetic resonance imaging apparatus according to claim 9, wherein the processing circuitry is further configured to adjust a time interval between refocus pulses in the LASER pulse sequence and the first and second crusher gradient fields according to a size of a volume of interest (VOI).

11. A magnetic resonance imaging method, comprising:
   designing a pulse sequence including a plurality of refocus pulses and a plurality of crusher gradient fields, in such a manner that a first crusher gradient field and a second crusher gradient field, each to be applied between adjacent refocus pulses of the plurality of refocus pulses, are combined into one; and
   acquiring magnetic resonance spectroscopic signals by executing the designed pulse sequence,
   wherein the pulse sequence includes six refocus pulses.

12. A non-transitory computer readable medium including computer executable instructions, wherein the instructions, when executed by a processor, cause the processor to perform a method comprising:
   designing a pulse sequence including a plurality of refocus pulses and a plurality of crusher gradient fields, in such a manner that a first crusher gradient field to be applied after a first refocus pulse group and a second crusher gradient field and a second crusher gradient field, each to be applied between adjacent refocus pulses of the plurality of refocus pulses, are combined into one; and
   acquiring magnetic resonance spectroscopic signals by executing the designed pulse sequence using a magnetic resonance imaging apparatus,
   wherein the pulse sequence includes six refocus pulses.

* * * * *